(12) United States Patent
Tseng et al.

(10) Patent No.: US 11,808,787 B2
(45) Date of Patent: Nov. 7, 2023

(54) PROBE CARD TESTING DEVICE

(71) Applicant: Unimicron Technology Corp., Taoyuan (TW)

(72) Inventors: Tzyy-Jang Tseng, Taoyuan (TW); John Hon-Shing Lau, Taoyuan (TW); Kuo Ching Tien, Chiayi (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 393 days.

(21) Appl. No.: 17/342,550

(22) Filed: Jun. 9, 2021

(65) Prior Publication Data

US 2022/0065897 A1 Mar. 3, 2022

Related U.S. Application Data

(63) Continuation-in-part of application No. 17/191,559, filed on Mar. 3, 2021, now Pat. No. 11,540,396.
(Continued)

(30) Foreign Application Priority Data

Jan. 12, 2021 (TW) .................... 110101060

(51) Int. Cl.
*H05K 1/02* (2006.01)
*H05K 1/03* (2006.01)
(Continued)

(52) U.S. Cl.
CPC ..... *G01R 1/07342* (2013.01); *G01R 1/07328* (2013.01); *H05K 1/112* (2013.01)

(58) Field of Classification Search
CPC ...... H05K 1/02; H05K 1/0271; H05K 1/0298; H05K 1/03; H05K 1/0306; H05K 1/111; H05K 1/112; H05K 1/183; H05K 3/303; H05K 3/4605; G01R 1/06; G01R 1/07; G01R 1/06733; G01R 1/06755; G01R 1/06772; G01R 1/07314; G01R 1/07342;
(Continued)

(56) References Cited

U.S. PATENT DOCUMENTS 6,768,064 B2  7/2004 Higuchi et al.
6,799,976 B1  10/2004 Mok et al.
(Continued)

*Primary Examiner* — Xiaoliang Chen
(74) *Attorney, Agent, or Firm* — JCIPRNET

(57) ABSTRACT

A probe card testing device includes a first sub-circuit board, a second sub-circuit board, a connecting structure layer, a fixing plate, a probe head and a plurality of conductive probes. The first sub-circuit board is electrically connected to the second sub-circuit board by the connecting structure layer. The fixing plate is disposed on the second sub-circuit board and includes an opening and an accommodating groove. The opening penetrates the fixing plate and exposes a plurality of pads on the second sub-circuit board. The accommodating groove is located on a side of the fixing plate relatively far away from the second sub-circuit board and communicates with the opening. The probe head is disposed in the accommodating groove of the fixing plate. The conductive probes are set on the probe head and in the opening of the fixing plate. One end of the conductive probes is in contact with the corresponding pads, respectively.

13 Claims, 3 Drawing Sheets

Related U.S. Application Data

(60) Provisional application No. 63/071,369, filed on Aug. 28, 2020.

(51) Int. Cl.
| | |
|---|---|
| *G01R 1/06* | (2006.01) |
| *G01R 1/07* | (2006.01) |
| *G01R 1/073* | (2006.01) |
| *H05K 1/11* | (2006.01) |

(58) Field of Classification Search
CPC ............ G01R 1/07328; G01R 1/07378; G01R 31/2831; G01R 31/2889
USPC ......................... 324/756.03; 174/262; 29/831
See application file for complete search history.

(56) References Cited

U.S. PATENT DOCUMENTS

| | | | | |
|---|---|---|---|---|
| 2008/0107863 | A1* | 5/2008 | Ikeda | ................ H01L 23/49827 428/137 |
| 2009/0211798 | A1* | 8/2009 | Horiuchi | ................ H05K 3/303 174/262 |
| 2020/0077512 | A1* | 3/2020 | Nasu | ................. G01R 31/2831 |
| 2022/0074971 | A1* | 3/2022 | Shuto | ................. G01R 1/06755 |

* cited by examiner

PROBE CARD TESTING DEVICE

CROSS-REFERENCE TO RELATED APPLICATION

This application is a continuation-in-part application of and claims the priority benefit of U.S. application Ser. No. 17/191,559, filed on Mar. 3, 2021, now pending. The prior U.S. application Ser. No. 17/191,559 claims the priority benefits of U.S. provisional application Ser. No. 63/071,369, filed on Aug. 28, 2020, and Taiwan application serial no. 110101060, filed on Jan. 12, 2021. The entirety of each of the above-mentioned patent applications is hereby incorporated by reference herein and made a part of this specification.

BACKGROUND

Technology Field

The disclosure relates to a testing device, and more particularly, to a probe card testing device.

Description of Related Art

Currently, probe card testing devices include a test printed circuit board, a space transformer, and a test probe head. The space transformer is located between the test printed circuit board and the test probe head and connected to the test printed circuit board through a ball grid array. Meanwhile, the spherical body material of the ball grid array is soft solder, for example. Moreover, to increase the reliability of the structure, an underfill can also be filled between the space transformer and the test printed circuit board to cover the ball grid array. However, the probe card testing devices require the use of solder and primer, so it is impossible to effectively reduce the cost and facilitate the manufacturing process, and there is also a problem of alignment accuracy between the test probe head and the test printed circuit board. Furthermore, because of the trends in finer pitches of the test chip-pads on the wafer, the pitch of multiple pads on the space transformer is finer.

SUMMARY

The disclosure provides a probe card testing device requiring no use of solder and primer, which contributes to the cost reduction and favorable structural reliability.

The probe card testing device of the disclosure includes a first sub-circuit board, a second sub-circuit board, a connecting structure layer, a fixing plate, a probe head, and multiple conductive probes. The second sub-circuit board is disposed on one side of the first sub-circuit board. The connecting structure layer is disposed between the first sub-circuit board and the second sub-circuit board. The first sub-circuit board is electrically connected to the second sub-circuit board by the connecting structure layer. The fixing plate is disposed on the second sub-circuit board and includes an opening and an accommodating groove. The opening penetrates the fixing plate and exposes multiple pads on the second sub-circuit board, and the accommodating groove is located on a side of the fixing plate relatively far away from the second sub-circuit board and communicates with the opening. The probe head is disposed in the accommodating groove of the fixing plate. The conductive probes are set on the probe head and located in the opening of the fixing plate. One end of the conductive probes respectively is in contact with corresponding pads.

In an embodiment of the disclosure, the first sub-circuit board includes a substrate, multiple circuit layers, multiple dielectric layers, at least one first conductive via, and multiple second conductive vias. The circuit layers and the dielectric layers are alternately disposed on opposite sides of the substrate. The first conductive via penetrates the substrate; the second conductive vias penetrate the dielectric layers; and the circuit layers are electrically connected to one another through the first conductive via and the second conductive vias.

In an embodiment of the disclosure, the first sub-circuit board further includes two solder mask layers respectively disposed on two outermost layers of the circuit layers, and part of the two outermost layers are exposed.

In an embodiment of the disclosure, the second sub-circuit board further includes multiple circuit layers, multiple dielectric layers, and multiple conductive vias. The circuit layers and the dielectric layers are alternately disposed. The conductive vias penetrate the dielectric layers and are electrically connected to the circuit layers and the pads, and at least one of the circuit layers includes multiple thin circuits.

In an embodiment of the disclosure, the second sub-circuit board further includes a circuit structure layer, a connection layer, and a reconfiguration circuit layer. The circuit structure layer includes multiple circuit layers, multiple first dielectric layers, and multiple first conductive vias. The circuit layer and the first dielectric layer are alternately disposed, and the first conductive vias penetrate the first dielectric layer and are electrically connected to the circuit layer. The connection layer includes a dielectric body and at least one second conductive via, and the second conductive via penetrates the dielectric body. The reconfiguration circuit layer includes multiple reconfiguration circuits, multiple second dielectric layers, multiple third conductive vias, and pads. The reconfiguration circuits and the second dielectric layers are alternately disposed. The third conductive vias penetrate the second dielectric layers and are electrically connected to the reconfiguration circuits and the pads. The second conductive vias of the connection layer are electrically connected to the circuit layers of the circuit structure layer and the reconfiguration circuits of the reconfiguration circuit layer.

In an embodiment of the disclosure, a metal line width and a metal line spacing of the circuit structure layer are greater than a metal line width and a metal line spacing of the reconfiguration circuit layer.

In an embodiment of the disclosure, the connecting structure layer includes multiple solder balls separately disposed between the first sub-circuit board and the second sub-circuit board.

In an embodiment of the disclosure, the connecting structure layer includes a dielectric body and at least one conductive via, and the conductive via penetrates the dielectric body.

In an embodiment of the disclosure, a diameter of the accommodating groove of the fixing plate is greater than a diameter of the opening.

In an embodiment of the disclosure, the probe head includes a first surface and a second surface opposite to each other. The first surface faces the pads, the fixing plate includes a configuration surface, and the accommodating groove is located on the configuration surface. There is a height difference between the configuration surface and the second surface.

In an embodiment of the disclosure, an edge of the fixing plate is aligned with an edge of the first sub-circuit board, an edge of the second sub-circuit board, and an edge of the connecting structure layer.

In an embodiment of the disclosure, the first sub-circuit board is a circuit board with multiple layers, and the second sub-circuit board is a reconfiguration circuit board.

In an embodiment of the disclosure, a metal line width and a metal line spacing of the first sub-circuit board are greater than a metal line width and a metal line spacing of the second sub-circuit board.

Based on the above, in the design of the probe card testing device in the disclosure, the fixing plate is disposed on the second sub-circuit board, the probe head is disposed in the accommodating groove of the fixing plate, the conductive probes are set on the probe head and located in the opening of the fixing plate, and one end of the conductive probes respectively is in contact with the corresponding pads of the second sub-circuit board. Accordingly, with the probe card testing device in the disclosure, no solder and primer are required, so the manufacturing cost of the probe card testing device can be effectively reduced; and the probe head is fixed in the accommodating groove, so the problem of alignment accuracy between the test probe head and the test printed circuit board is prevented. Moreover, without the use of solder, the bonding yield of the first sub-circuit board, the second sub-circuit board, and the connecting structure layer can be effectively improved, thereby improving the structural reliability of the probe card testing device in the disclosure.

In order to make the aforementioned features and advantages of the disclosure comprehensible, embodiments accompanied with drawings are described in detail below.

DESCRIPTION OF THE EMBODIMENTS

Figure 1:
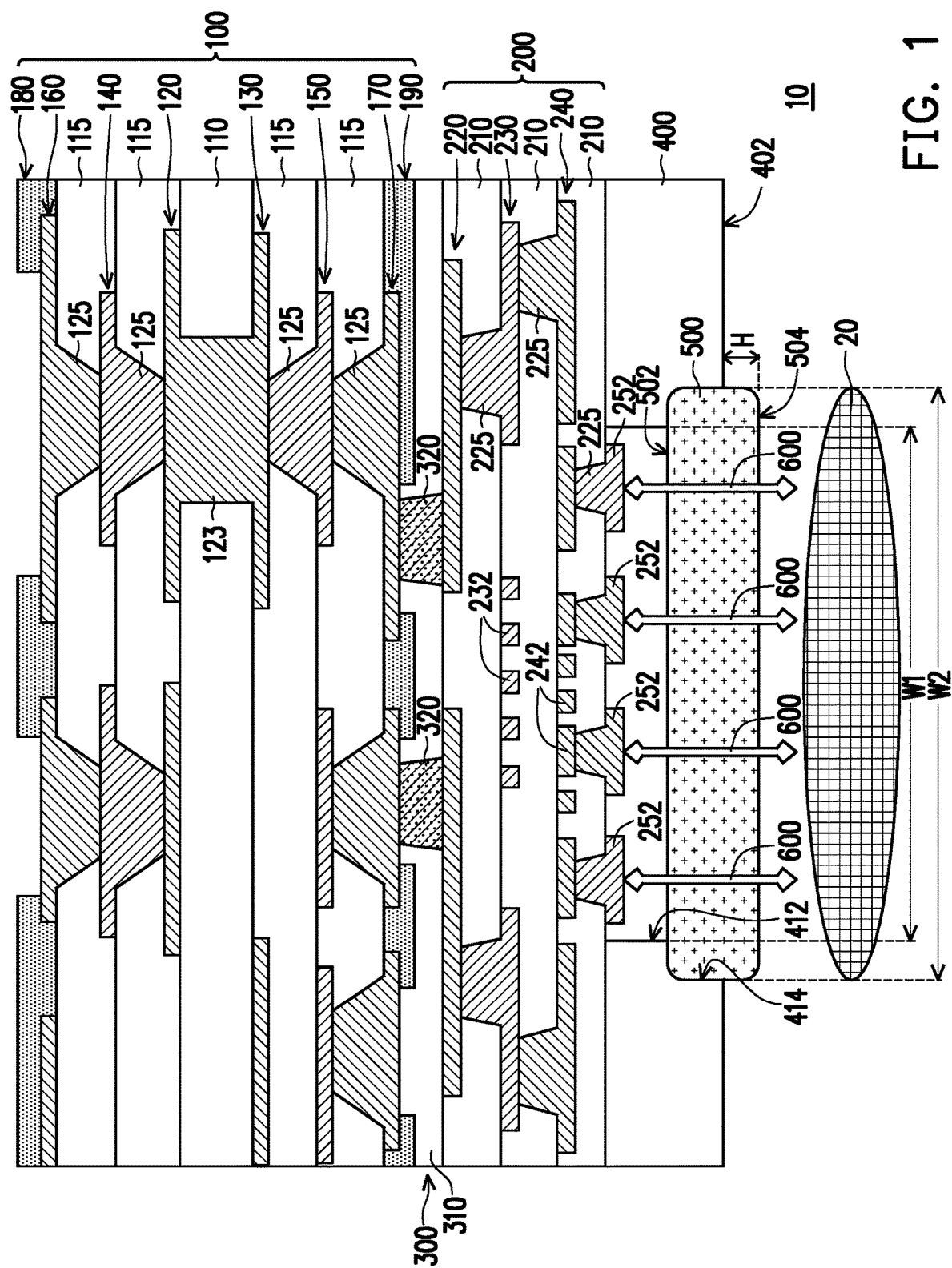
FIG. 1 is a schematic cross-sectional view of a probe card testing device according to an embodiment of the disclosure.

FIG. 1 is a schematic cross-sectional view of a probe card testing device according to an embodiment of the disclosure. Referring to FIG. 1, in the embodiment, a probe card testing device 10 includes a first sub-circuit board 100, a second sub-circuit board 200, a connecting structure layer 300, a fixing plate 400, a probe head 500, and multiple conductive probes 600. The second sub-circuit board 200 is disposed on one side of the first sub-circuit board 100. The connecting structure layer 300 is disposed between the first sub-circuit board 100 and the second sub-circuit board 200, and the first sub-circuit board 100 is electrically connected to the second sub-circuit board 200 through the connecting structure layer 300. That is, it requires no solder and primer to connect the first sub-circuit board 100 and the second sub-circuit board; and without the use of solder, the bonding yield of the first sub-circuit board 100, the second sub-circuit board 200, and the connecting structure layer 300 may be effectively improved.

Furthermore, in the embodiment, the fixing plate 400 is disposed on the second sub-circuit board 200, and the fixing plate 400 includes an opening 412 and an accommodating groove 414. The opening 412 penetrates the fixing plate 400 and exposes multiple pads 252 on the second sub-circuit board 200. The accommodating groove 414 is located on a side of the fixing plate 400 relatively far away from the second sub-circuit board 200 and communicates with the opening 412. The probe head 500 is disposed in the accommodating groove 414 of the fixing plate 400, the conductive probes 600 are set in the probe head 500 and in the opening 412 of the fixing plate 400, and one end of the conductive probes 600 is in contact with the corresponding pads 252 respectively. In other words, in the embodiment, the probe head 500 is positioned on the second sub-circuit board 200 through the accommodating groove 414 of the fixing plate 400, so no solder and primer are used, which can effectively improve the assembly yield between the probe head 500 and the fixing plate 400, and the problem of alignment accuracy between the probe head 500 and the second sub-circuit board 200 is prevented.

Furthermore, in the embodiment, the first sub-circuit board 100 includes a substrate 110; multiple circuit layers 120, 130, 140, 150, 160, and 170; multiple dielectric layers 115; at least one first conductive via (a first conductive via 123 is schematically illustrated); and multiple second conductive vias 125. The circuit layers 120, 130, 140, 150, 160, and 170 and the dielectric layers 115 are alternately disposed on opposite sides of the substrate 110. The first conductive via 123 penetrates the substrate 110, and the second conductive vias 125 penetrate the dielectric layers 115. The circuit layers 120, 130, 140, 150, 160, and 170 are electrically connected to one another through the first conductive via 123 and the second conductive vias 125. Meanwhile, the circuit layers 120 and 130 are electrically connected to each other through the first conductive via 123; the circuit layers 120, 140, and 160 are electrically connected to one another through the second conductive vias 125; and the circuit layers 130, 150, and 170 are electrically connected to one another through the second conductive vias 125. Furthermore, in the embodiment, the first sub-circuit board 100 further includes two solder mask layers 180 and 190 respectively disposed on the two circuit layers 160 and 170 which are the outermost layers of the circuit layers 120, 130, 140, 150, 160, and 170; and part of the two circuit layers 160 and 170 are exposed. In short, the first sub-circuit board 100 in the embodiment is implemented as a circuit board with multiple layers, but the disclosure is not limited thereto.

Referring to FIG. 1 again, the second sub-circuit board 200 in the embodiment further includes multiple circuit layers 220, 230, and 240; multiple dielectric layers 210; and multiple conductive vias 225. The circuit layers 220, 230, and 240 and the dielectric layers 210 are alternately disposed, and the pads 252 are located on the outermost dielectric layer 210. The conductive vias 225 penetrate the dielectric layers 210 and are electrically connected to the circuit layers 220, 230, and 240 and the pads 252. At least one of the circuit layers 220, 230, and 240 (the circuit layers 230 and 240 are schematically illustrated) includes multiple thin circuits 232 and 242. In short, the second sub-circuit board 200 is implemented as a reconfigured circuit substrate, and a metal line width and a metal line spacing of the first sub-circuit board 100 are greater than a metal line width and a metal line spacing of the second sub-circuit board 200. Also, the pitch of the multiple pads 252 on the second sub-circuit board 200 is much less than the pitch of the multiple pads (i.e., where the circuit layers 160 and 170 respectively are exposed by the solder mask layers 180 and 190) on the first sub-circuit board 100.

Furthermore, in the embodiment, the connecting structure layer 300 includes a dielectric body 310 and at least one conductive via (two conductive vias 320 are schematically illustrated), and the conductive via 320 penetrates the dielectric body 310. Meanwhile, the material of the dielectric body 310 includes prepreg (PP), and for example, the material of the conductive via 320 is a conductive metal paste, thereby having the characteristics of electrical and thermal conductivity and being suitable for bonding with any metal material.

Note that by a thermocompression bonding process, the first sub-circuit board 100 is electrically connected to the second sub-circuit board 200 through the connecting structure layer 300. Specifically, during the thermocompression bonding process, the circuit layer 170 of the first sub-circuit board 100 and the circuit layer 220 of the second sub-circuit board 200 are directly in contact with the surface of the dielectric body 310 and squeeze the conductive via 320 which is then deformed. At the stage, the dielectric body 310 is not completely cured and has flexibility and viscosity, so it can bond the circuit layer 170 and the circuit layer 220 and be squeezed into the surface exposed by the solder mask 190. After pressing and curing are performed, the dielectric body 310 of the connecting structure layer 300 changes from a B-stage state to a C-stage state. This means that the connecting structure layer 300 is in a fully cured state; and the first sub-circuit board 100, the second sub-circuit board 200, and the connecting structure layer 300 are firmly bonded together. At this stage, the circuit layer 170 of the first sub-circuit board 100 is electrically connected to the circuit layer 220 of the second sub-circuit board 200 through the conductive via 320 of the connecting structure layer 300. Accordingly, without solder and primer, the bonding yield of the first sub-circuit board 100, the second sub-circuit board 200, and the connecting structure layer 300 can be effectively improved, thereby improving the structural reliability of the probe card testing device 10 in the embodiment.

Referring to FIG. 1 again, in the embodiment, the probe head 500 is disposed in the accommodating groove 414 of the fixing plate 400, and the conductive probes 600 are set to be located in the probe head 500 and in the opening 412 of the fixing plate 400. Meanwhile, the probe head 500 has a first surface 502 and a second surface 504 opposite to each other. The first surface 502 faces the pads 252, the fixing plate 400 has a configuration surface 402, and the accommodating groove 414 is located on the configuration surface 402. In particular, there is a height difference H between the configuration surface 402 of the fixing plate 400 and the second surface 504 of the probe head 500, which can prevent a test wafer 20 from being directly in contact with the configuration surface 402 of the fixing plate 400 without affecting the electrical test result. Preferably, a diameter W2 of the accommodating groove 414 of the fixing plate 400 is greater than a diameter W1 of the opening 412, the diameter W2 of the accommodating groove 414 is the length of the probe head 500, and the depth of the accommodating groove 414 is lesser than the width of the probe head 500, so the second surface 504 of the probe head 500 is in a place higher than that of the configuration surface 402 of the fixing plate 400. Moreover, the edge of the fixing plate 400 in the embodiment is substantially aligned with the edge of the first sub-circuit board 100, the edge of the second sub-circuit board 200, and the edge of the connecting structure layer 300.

It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2:
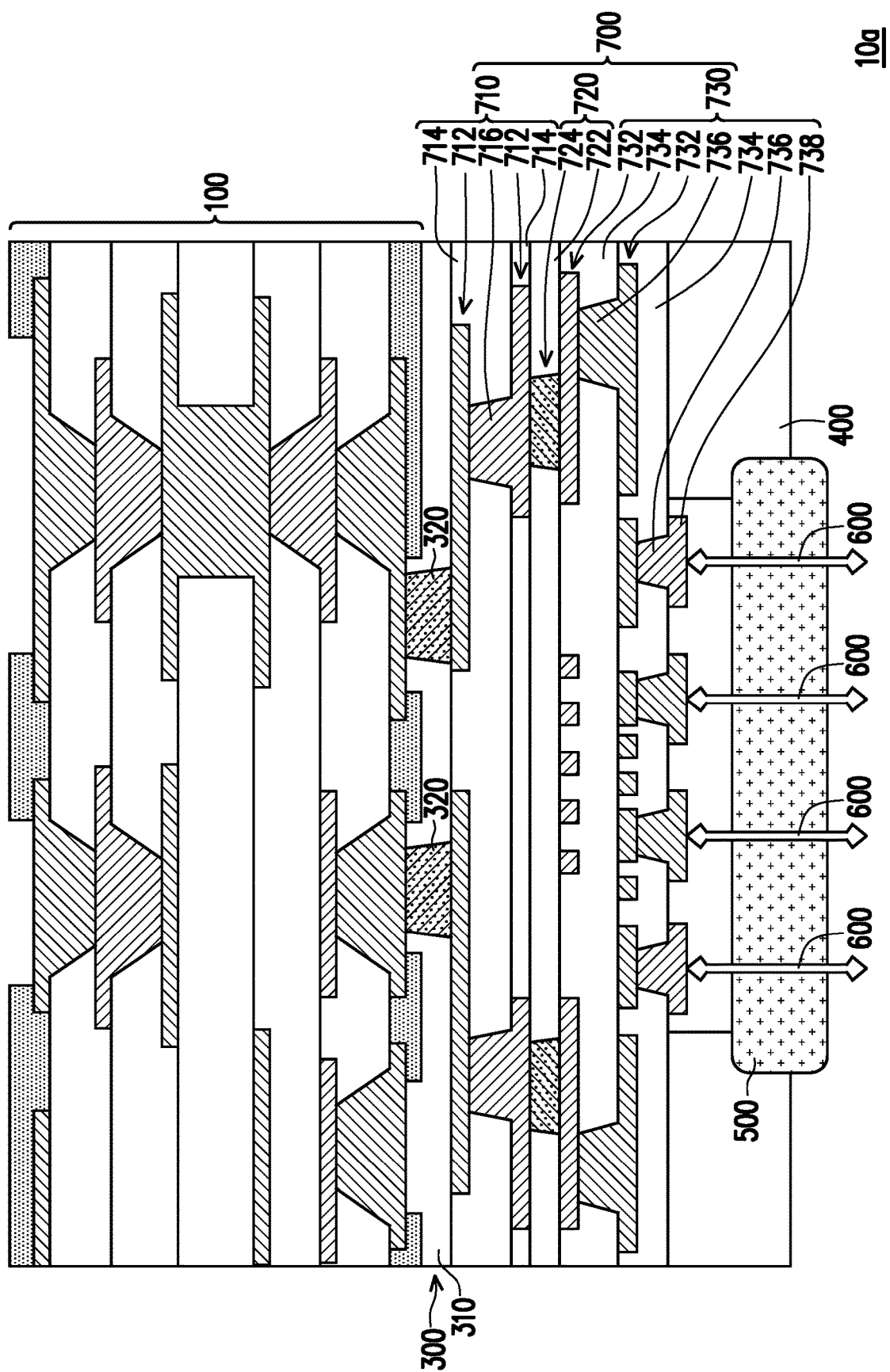
FIG. 2 is a schematic cross-sectional view of a probe card testing device according to another embodiment of the disclosure.

FIG. 2 is a schematic cross-sectional view of a probe card testing device according to another embodiment of the disclosure. Referring to both FIG. 1 and FIG. 2, a probe card testing device 10a in the embodiment is similar to the probe card testing device 10. The difference between the two is that a second sub-circuit board 700 in the embodiment is different from the second sub-circuit board 200. Specifically, in the embodiment, the second sub-circuit board 700 further includes a circuit structure layer 710, a connection layer 720, and a reconfiguration circuit layer 730. The circuit structure layer 710 includes multiple circuit layers 712, multiple first dielectric layers 714, and multiple first conductive vias 716. The circuit layers 712 and the first dielectric layers 714 are alternately disposed, and the first conductive vias 716 penetrate the first dielectric layers 714 and are electrically connected to the circuit layers 712. The connection layer 720 includes a dielectric body 722 and at least one second conductive via 724, and the second conductive via 724 penetrates the dielectric body 722. The reconfiguration circuit layer 730 includes multiple reconfiguration circuits 732, multiple second dielectric layers 734, multiple third conductive vias 736, and the pads 738. The reconfiguration circuits 732 and the second dielectric layers 734 are alternately disposed. The third conductive vias 736 penetrate the second dielectric layers 734 and are electrically connected to the reconfiguration circuits 732 and the pads 738. The second conductive via 724 of the connection layer 720 is electrically connected to the circuit layers 712 of the circuit structure layer 710 and the reconfiguration circuits 732 of the reconfiguration circuit layer 730, and one end of each of the conductive probes 600 corresponds to the pads 738, respectively.

In other words, the second sub-circuit board 700 in the embodiment is a composite circuit board, in which the circuit structure layer 710 is connected to the reconfiguration circuit layer 730 through the connection layer 720 without solder and primer. Therefore, the bonding yield between the circuit structure layer 710, the connection layer 720, and the reconfiguration circuit layer 730 can be effectively improved, thereby improving the structural reliability of the probe card testing device 10a in the embodiment. Also, the pitch of the multiple pads on the reconfiguration circuit layer 730 is much less than the pitch of the multiple pads on the circuit structure layer 710, that is, the metal line width and the metal line spacing of the circuit structure layer 710 are greater than the metal line width and the metal line spacing of the reconfiguration circuit layer 710.

Figure 3:
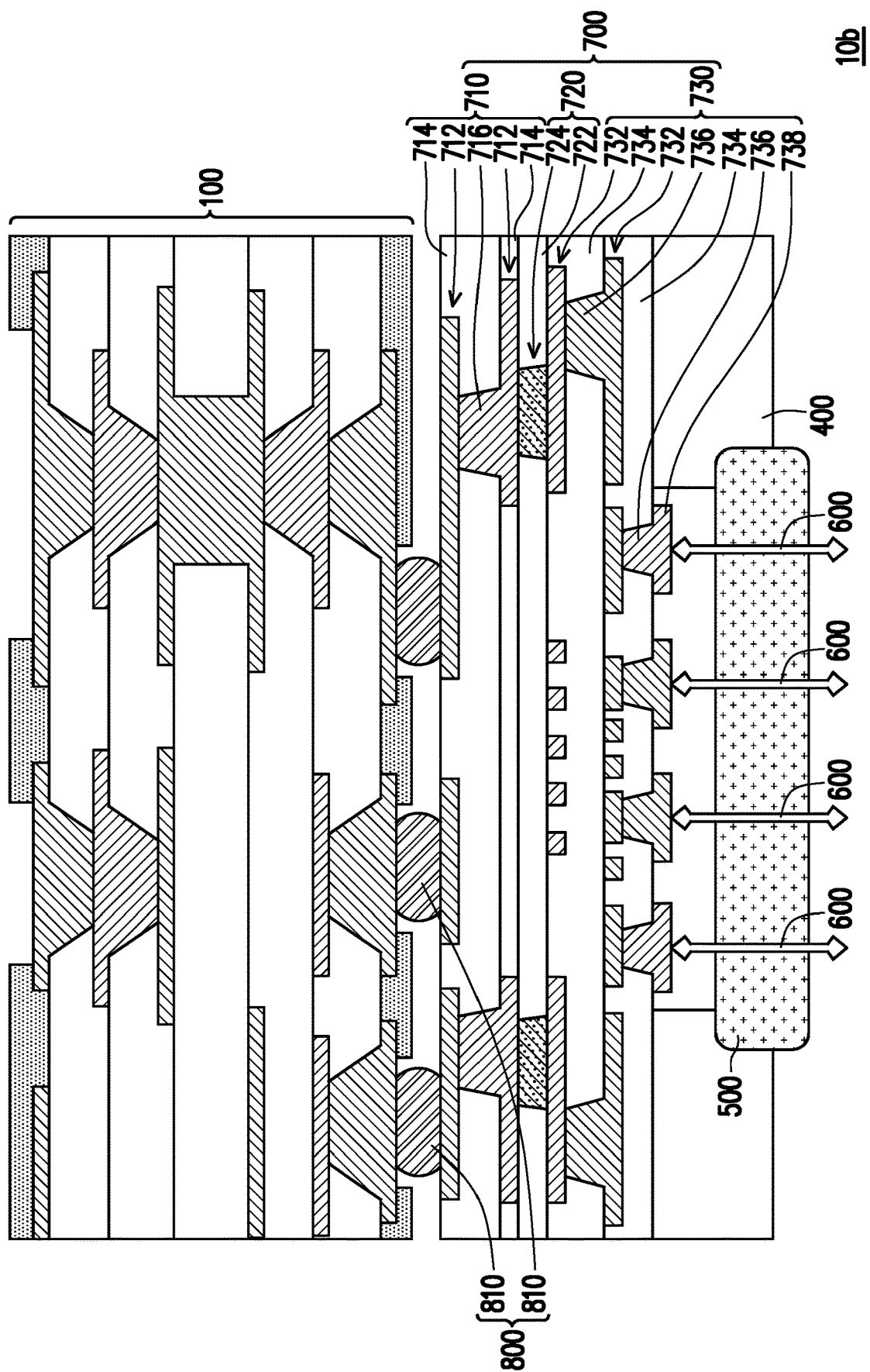
FIG. 3 is a schematic cross-sectional view of a probe card testing device according to another embodiment of the disclosure.

FIG. 3 is a schematic cross-sectional view of a probe card testing device according to another embodiment of the disclosure. Referring to both FIG. 2 and FIG. 3, a probe card testing device 10b in the embodiment is similar to the probe card testing device 10a. The difference between the two is that the structure of a connecting structure layer 800 in the embodiment is different from that of the connecting structure layer 300. Specifically, the connecting structure layer 800 includes multiple solder balls 810 separately disposed between the first sub-circuit board 100 and the second sub-circuit board 700. The solder balls 810 are electrically connected to the circuit layer 170 of the first sub-circuit board 100 and the circuit layer 712 of the circuit structure layer 710 of the second sub-circuit board 700.

Based on the above, in the design of the probe card testing device in the disclosure, the fixing plate is disposed on the second sub-circuit board, the probe head is disposed in the accommodating groove of the fixing plate, the conductive probes are set on the probe head and located in the opening of the fixing plate, and one end of the conductive probes respectively is in contact with the corresponding pads of the second sub-circuit board. Accordingly, with the probe card testing device in the disclosure, no solder and primer are required, so the manufacturing cost of the probe card testing device can be effectively reduced; and the probe head is fixed in the accommodating groove, so the problem of alignment accuracy between the test probe head and the test printed circuit board is prevented. Moreover, without the use of solder, the bonding yield of the first sub-circuit board, the second sub-circuit board, and the connecting structure layer can be effectively improved, thereby improving the structural reliability of the probe card testing device in the disclosure.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A probe card testing device, comprising:
a first sub-circuit board;
a second sub-circuit board disposed on one side of the first sub-circuit board;
a connecting structure layer disposed between the first sub-circuit board and the second sub-circuit board, wherein the first sub-circuit board is electrically connected to the second sub-circuit board by the connecting structure layer;
a fixing plate disposed on the second sub-circuit board and comprising an opening and an accommodating groove, wherein the opening penetrates the fixing plate and exposes a plurality of pads on the second sub-circuit board, and the accommodating groove is located on a side of the fixing plate relatively far away from the second sub-circuit board and communicates with the opening;
a probe head disposed in the accommodating groove of the fixing plate; and
a plurality of conductive probes set on the probe head and located in the opening of the fixing plate, wherein one end of the plurality of the conductive probes respectively is in contact with corresponding pads.

2. The probe card testing device of claim 1, wherein the first sub-circuit board comprises a substrate, a plurality of circuit layers, a plurality of dielectric layers, at least one first conductive via, and a plurality of second conductive vias; the plurality of the circuit layers and the plurality of the dielectric layers are alternately disposed on opposite sides of the substrate; the at least one first conductive via penetrates the substrate; the plurality of the second conductive vias penetrate the plurality of the dielectric layers; and the plurality of the circuit layers are electrically connected to one another through the at least one first conductive via and the plurality of the second conductive vias.

3. The probe card testing device of claim 2, wherein the first sub-circuit board further comprises:

two solder mask layers respectively disposed on two outermost layers of the plurality of the circuit layers, wherein part of the two outermost layers are exposed.

4. The probe card testing device of claim 1, wherein the second sub-circuit board further comprises a plurality of circuit layers, a plurality of dielectric layers, and a plurality of conductive vias; the plurality of the circuit layers and the plurality of the dielectric layers are alternately disposed; the plurality of the conductive vias penetrate the plurality of the dielectric layers and are electrically connected to the plurality of the circuit layers and the plurality of the pads; and at least one of the plurality of the circuit layers comprises a plurality of thin circuits.

5. The probe card testing device of claim 1, wherein the second sub-circuit board further comprises:
a circuit structure layer comprising a plurality of circuit layers, a plurality of first dielectric layers, and a plurality of first conductive vias, wherein the plurality of the circuit layers and the plurality of the first dielectric layers are alternately disposed, and the plurality of the first conductive vias penetrate the plurality of the first dielectric layers and are electrically connected to the plurality of the circuit layers;
a connection layer comprising a dielectric body and at least one second conductive via, wherein the at least one second conductive via penetrates the dielectric body; and
a reconfiguration circuit layer comprising a plurality of reconfiguration circuits, a plurality of second dielectric layers, a plurality of third conductive vias, and the plurality of the pads, wherein the plurality of the reconfiguration circuits and the plurality of the second dielectric layers are alternately disposed, and the plurality of the third conductive vias penetrate the plurality of the second dielectric layers and are electrically connected to the plurality of the reconfiguration circuits and the plurality of the pads, wherein the at least one second conductive via of the connection layer is electrically connected to the plurality of the circuit layers of the circuit structure layer and the plurality of the reconfiguration circuits of the reconfiguration circuit layer.

6. The probe card testing device of claim 5, wherein a metal line width and a metal line spacing of the circuit structure layer are greater than a metal line width and a metal line spacing of the reconfiguration circuit layer.

7. The probe card testing device of claim 1, wherein the connecting structure layer comprises a plurality of solder balls separately disposed between the first sub-circuit board and the second sub-circuit board.

8. The probe card testing device of claim 1, wherein the connecting structure layer comprises a dielectric body and at least one conductive via, and the at least one conductive via penetrates the dielectric body.

9. The probe card testing device of claim 1, wherein a diameter of the accommodating groove of the fixing plate is greater than a diameter of the opening.

10. The probe card testing device of claim 1, wherein the probe head comprises a first surface and a second surface opposite to each other, the first surface faces the plurality of the pads, the fixing plate comprises a configuration surface, the accommodating groove is located on the configuration surface, and there is a height difference between the configuration surface and the second surface.

11. The probe card testing device of claim 1, wherein an edge of the fixing plate is aligned with an edge of the first sub-circuit board, an edge of the second sub-circuit board, and an edge of the connecting structure layer.

12. The probe card testing device of claim 1, wherein the first sub-circuit board is a circuit board with a plurality of layers, and the second sub-circuit board is a reconfiguration circuit board.

13. The probe card testing device of claim 12, wherein a metal line width and a metal line spacing of the first sub-circuit board are greater than a metal line width and a metal line spacing of the second sub-circuit board.

* * * * *